US007213185B2

(12) United States Patent
Barone et al.

(10) Patent No.: US 7,213,185 B2
(45) Date of Patent: May 1, 2007

(54) BUILT-IN SELF TEST CIRCUIT FOR INTEGRATED CIRCUITS

(75) Inventors: Massimiliano Barone, Bresso (IT); Antonio Griseta, Mola di Bari (IT)

(73) Assignee: STMicroelectronics S.r.l, Agrate Brianza (IT)

( * ) Notice: Subject to any disclaimer, the term of this patent is extended or adjusted under 35 U.S.C. 154(b) by 399 days.

(21) Appl. No.: 10/638,284

(22) Filed: Aug. 7, 2003

(65) Prior Publication Data

US 2004/0107396 A1  Jun. 3, 2004

(30) Foreign Application Priority Data

Aug. 8, 2002  (EP)  .................. 02425519

(51) Int. Cl.
*G01R 31/3187* (2006.01)
*G01R 31/333* (2006.01)

(52) U.S. Cl. ...................... 714/733; 714/718
(58) Field of Classification Search ............. 714/700, 714/733, 718, 25, 42, 54, 723; 365/200, 365/201; 711/164
See application file for complete search history.

(56) References Cited

U.S. PATENT DOCUMENTS 3,971,916 A * 7/1976 Moreno ............... 711/164
6,067,262 A * 5/2000 Irrinki et al. ............... 365/201
6,374,370 B1* 4/2002 Bockhaus et al. ............ 714/39
6,553,526 B1* 4/2003 Shephard, III .............. 714/733
6,564,349 B1* 5/2003 Mitten et al. ............... 714/733
6,691,206 B1* 2/2004 Rubinstein .................. 711/105
6,691,264 B2* 2/2004 Huang ........................ 714/723
2005/0210352 A1* 9/2005 Ricchetti et al. ............ 714/733

FOREIGN PATENT DOCUMENTS

EP  0 517 269 A2  12/1992

* cited by examiner

*Primary Examiner*—Cynthia Britt
*Assistant Examiner*—Dipakkumar Gandhi
(74) *Attorney, Agent, or Firm*—Lisa K. Jorgenson; Dennis M. de Guzman; Seed IP Law Group PLLC

(57) ABSTRACT

A built-in self-test circuit adapted to be embedded in an integrated circuit for testing the integrated circuit, including in particular a collection of addressable elements, for example a semiconductor memory. The BIST circuit comprises a general-purpose data processor programmable for executing a test program for testing the integrated circuit. The BIST circuit comprises an accelerator circuit cooperating with the general-purpose data processor for autonomously conducting operations on the integrated circuit according to the test program. The accelerator circuit comprises configuration means adapted to be loaded with configuration parameters for adapting the accelerator circuit to the specific type of integrated circuit and the specific type of test program.

26 Claims, 7 Drawing Sheets

BUILT-IN SELF TEST CIRCUIT FOR INTEGRATED CIRCUITS

BACKGROUND OF THE INVENTION

1. Field of the Invention

The present invention generally relates to the field of integrated circuits (ICs), and particularly to built-in self test (BIST) circuits embedded in ICs for implementing self-test routines.

2. Description of the Related Art

The testing of ICs after manufacturing has a significant impact on the overall IC production costs. As the ICs become more and more complex, test routines for properly and extensively testing the ICs increase in number and complexity. The kind of tests to be conducted necessarily varies from IC to IC. Expensive test equipment is thus needed.

In order to at least partly relieve the test equipment of the burden of conducting all the test phases, on-chip test circuitry is provided in the ICs for autonomously conducting part, if not all, of the test. This circuitry is commonly referred to as built-in self test (BIST) circuitry.

Two approaches are normally followed in designing a BIST circuitry.

According to a first approach, for every kind of IC (e.g., stand-alone memories, which can be DRAMs, SRAMs, EPROMs, Flash memories, EEPROMs, microprocessors, microcontrollers with embedded RAM and ROM, etc.) a dedicated BIST circuitry is developed. The BIST circuitry, being specific and customized for that IC, is fast in conducting the required tests, but it is not flexible, and cannot be straightforwardly exploited in different ICs. The design efforts made for developing the dedicated BIST circuit are high, and the dedicated BIST circuit cannot be easily re-used in different ICs.

In a second approach, a general purpose microprocessor is embedded in the IC to be tested. This solution is highly flexible, since a general purpose microprocessor can in principle run every test routine on every IC. However, due to the very fact that the microprocessor is designed for a general purpose, it is not normally optimized for speeding up the test routines on specific ICs; in order to reduce the test time, a high-performance microprocessor is needed (e.g., high clock frequency, RISC, 32-bit or more data word, etc.): the IC area overhead caused by the provision of a high-performance microprocessor can soon become unacceptable.

BRIEF SUMMARY OF THE INVENTION

An embodiment of the present invention provides a BIST circuit that is not affected by the drawbacks of the known BIST circuits. In particular, the BIST circuit combines flexibility, speed and limited IC area overhead.

Summarizing, the BIST circuit comprises a general-purpose data processor programmable for executing a test program for testing the integrated circuit, and an accelerator circuit cooperating with the general-purpose data processor for autonomously conducting operations on the integrated circuit according to the test program.

The accelerator circuit is configurable, comprising a configuration circuit to be loaded with configuration parameters for adapting the accelerator circuit to the specific type of integrated circuit and the specific type of test program.

BRIEF DESCRIPTION OF THE SEVERAL VIEWS OF THE DRAWINGS

The features and advantages of the present invention will be made apparent by the following detailed description of an embodiment thereof, provided merely by way of non-limitative example, which will be made in connection with the attached drawings, wherein.

DETAILED DESCRIPTION OF THE INVENTION

Figure 1:
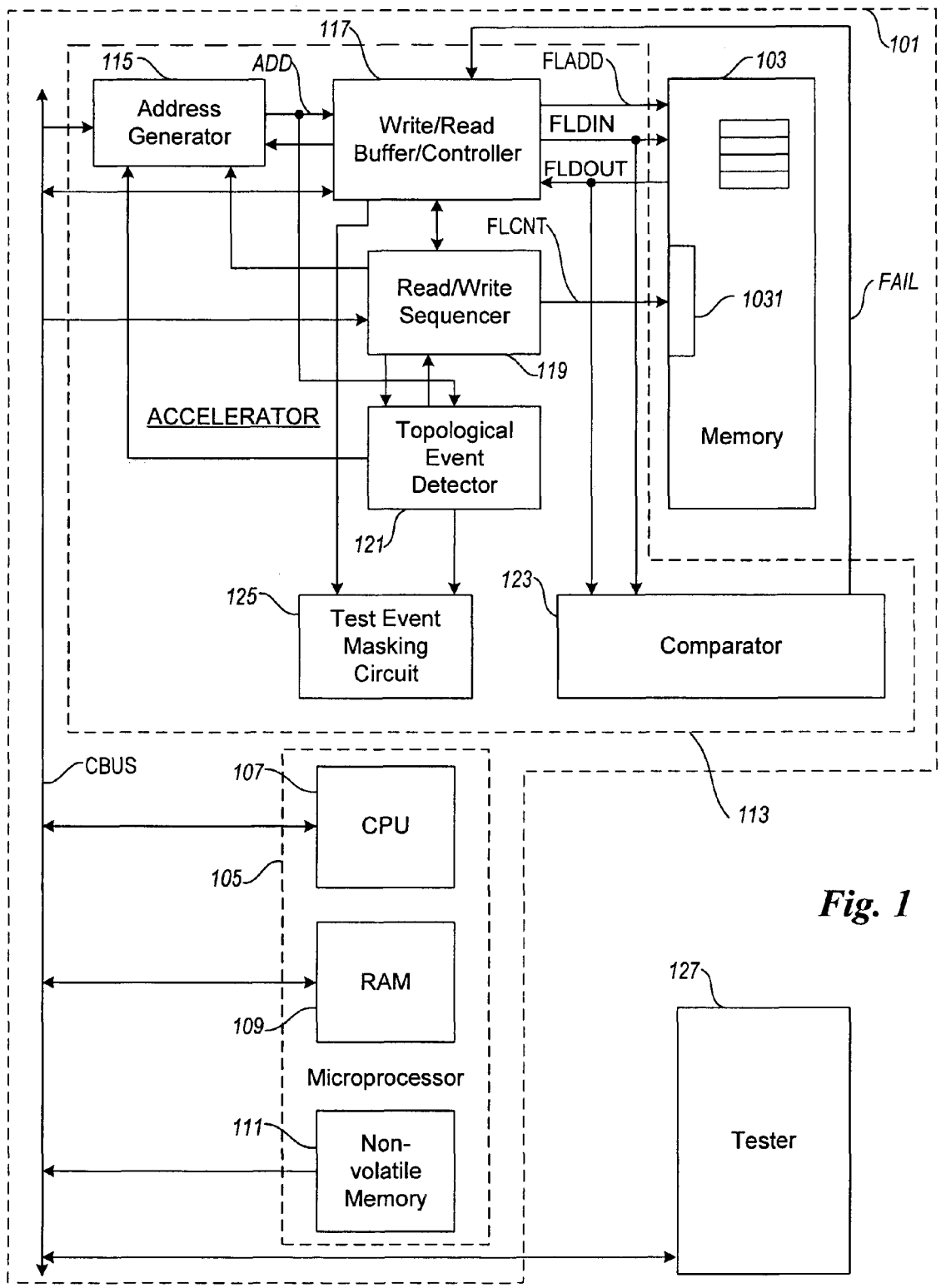
FIG. 1 is a functional block diagram of a BIST circuit according to an embodiment of the present invention, embedded in an integrated circuit including a memory, particularly a Flash memory.

With reference to the drawings, and particularly to FIG. 1, a BIST circuit according to an embodiment of the present invention is shown in terms of functional blocks. In particular, the BIST circuit is embedded in an integrated circuit (IC) 101, supposed to include a Flash memory 103, for example a stand-alone memory. Clearly, the memory 103 might be one of several subsystems embedded in the IC 101: for the example, the IC 101 might be a microcontroller with embedded Flash, EEPROM, RAM.

The BIST circuit includes a general-purpose microprocessor 105, including a central processing unit (CPU) 107, a random access memory (RAM) 109, used by the CPU 107 as a working memory for temporarily storing data, and a non-volatile memory (ROM, EPROM, EEPROM or Flash) 111, used for storing the program to be executed by the CPU 107, as well as data to be preserved in case of power failure.

In addition to the microprocessor 105, the BIST circuit includes an accelerator circuit (hereinafter, accelerator) 113. The accelerator 113 includes an address generator circuit (hereinafter, address generator) 115, a write/read buffer/controller 117, a read/write sequencer circuit (hereinafter, read/write sequencer) 119, a topological event detector circuit (in the following, topological event detector) 121. In the shown embodiment, the accelerator 113 also includes a comparator circuit 123, for comparing data words read from the Flash memory 103 with expected data words provided by the write/read buffer/controller 117, and a test event masking circuit 125. The topological event detector 121 signals to the microprocessor 105 the occurrence of particular topological events during the execution of test routines on the memory 103; topological events may include completion of the test on a memory sector or on the whole memory matrix. The test event masking circuit 125 allows masking some topological events, thereby inhibiting the topological events being signaled to the microprocessor 105.

A bus of signal lines CBUS enables communication between the microprocessor 105 and the units of the accelerator 113, particularly the address generator 115, the write/read buffer/controller 117, the read/write sequencer 119, the topological event detector 121 and the test event masking circuit 125. The bus CBUS is also used by the CPU 107 for communicating with the RAM 109 and the ROM 111.

It is pointed out that the accelerator 113 is not custom designed for a particular kind of Flash memory, nor is it specially designed for a running a particular test program. On the contrary, the accelerator 113 is designed to work with any kind of Flash memory, and is configurable to adapt to the particular Flash memory and test program. Thanks to the provision of the accelerator 113, the performance requirements for the general purpose microprocessor 105 are not particularly stringent.

Figure 2:
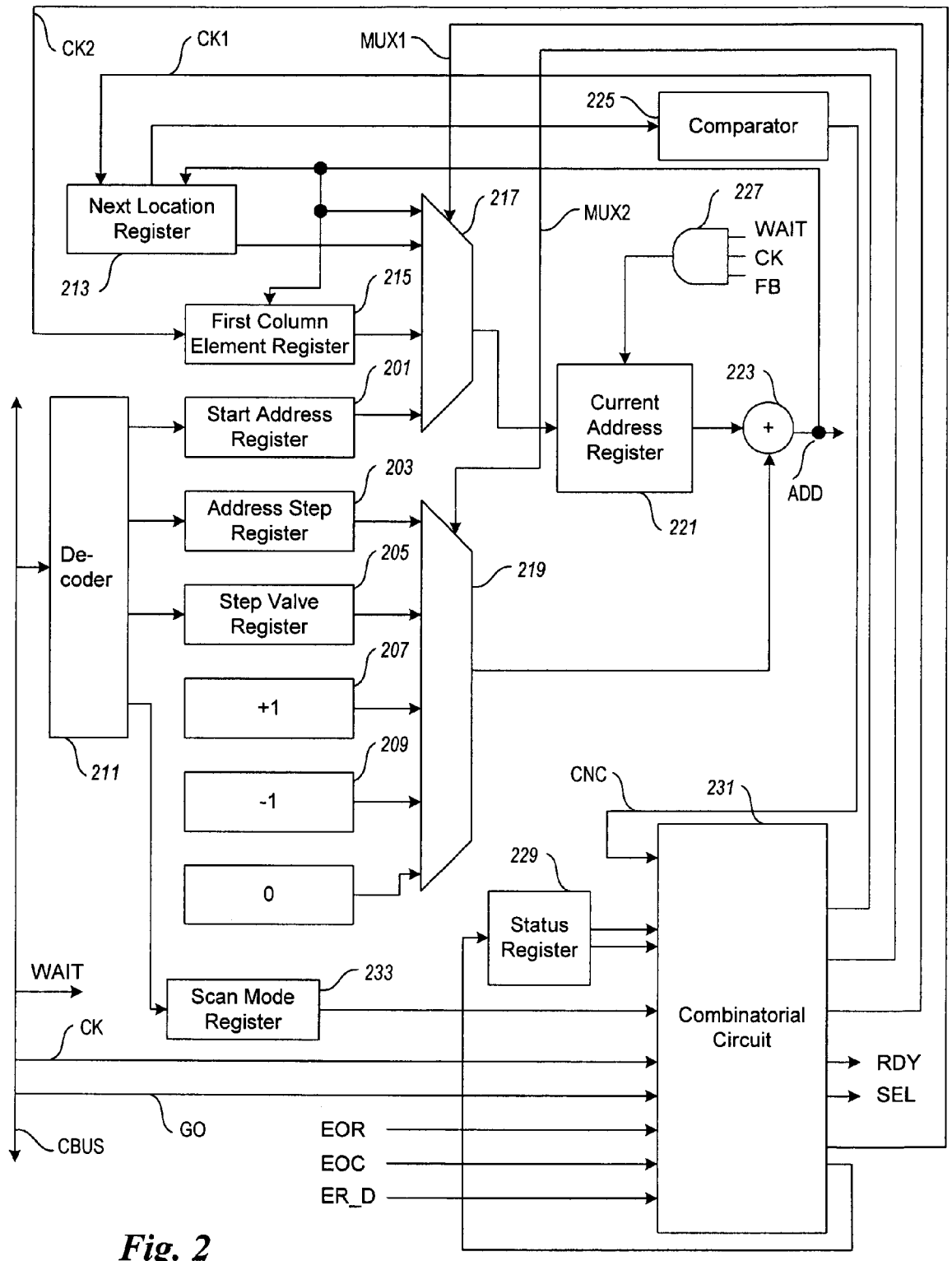
FIG. 2 is a functional block diagram of a functional block of the BIST circuit, including an address generator unit for generating addresses for accessing the memory, in an embodiment of the present invention.

FIG. 2 shows in greater detail, albeit still in terms of functional blocks, the structure of the address generator 115, in one embodiment of the present invention.

The circuit includes a plurality of configuration parameter registers, adapted to store configuration parameters, loaded by the microprocessor 105 during a configuration phase of the BIST circuit, for defining a prescribed address generation pattern. In particular, a register 201 (start address register) is used to store an address generation pattern start address, i.e. the address identifying the Flash location from which the self-test routine is to be started.

A register 203 (address step register) is used to store a value defining the increment step between consecutive addresses in the address generation pattern.

While the increment step stored in the register 203 is used during the normal address generation, four registers 205, 207, 209 and 235 are provided to store particular address increment steps, to be used, depending on the kind of test routine, when particular topologic events occurs, signaled by the topological event detector 121. In particular, the register 205 is used to store a configurable step value, loaded during the BIST circuit configuration phase, which may be different from the step value stored in the register 203. The registers 207, 209 and 235 store a 1[d], a −1[d] and a 0[d] step values (the suffix [d] indicating that a decimal notation is used). For example, as will be described in greater detail later on, the 1[d] and −1[d] step values are used when, performing a test routine that involves accessing the memory 103 according to a checkerboard pattern, an end of row is signaled by the topological event detector 121.

A further configuration parameter register 233 is provided, loaded by the microprocessor 105 in the BIST circuit configuration phase; the content of the register 233 specifies a scan mode (by rows or by columns) of the matrix of memory elements in the Flash memory.

The configuration parameter registers 201, 203, 205 and 233 are loaded by the microprocessor 105, in the BIST circuit configuration phase: in order to load a desired value in a configuration parameter register, the microprocessor 105 puts the desired value and a digital code identifying the desired register to be loaded with that value on the bus CBUS. A decoder circuit 211 decodes the digital code identifying the addressed register 201, 203, 205 or 233, and routes the value to be loaded to the addressed register.

The address generator 115 comprises additional registers. A register 213 is used in a write verify phase of a test routine following a write phase, for storing the address of the next Flash memory location in which written data, written during the write phase, are expected to be found.

A register 215 is used when the selected scan mode involves a scan of the memory elements of the Flash memory which is different from the natural sequence of addresses (for example, scan by columns when the addresses increases moving along the rows).

The registers 201, 213 and 215 feed a first multiplexer 217; the registers 203, 205, 207, 209 and 235 feed a second multiplexer 219. The first and second multiplexers 217 and 219 are controlled by respective control signals MUX1 and MUX2.

An output of the first multiplexer 217 feeds a current address register 221, used to store the value of the current address, which is to be incremented/decremented of a prescribed step for addressing the next Flash location. The loading into the current address register 221 of the address value present at the output of the first multiplexer 217 is controlled by an output signal of a three-input NAND logic gate 227: the NAND gate 227 receives a master clock signal CK, and two control signals WAIT and FB. The master clock signal CK is the master clock of the BIST circuit, and is delivered to all the units of the accelerator 113 through the bus CBUS. The control signal WAIT is asserted by the microprocessor 105, when it is necessary to suspend the operation of the accelerator 113, for example in consequence of a particular topological event detected by the topological event detector 121; also this signal is delivered to the units of the accelerator 113 through the bus CBUS. The control signal FB is generated by the write/read buffer/controller 117. Provided that the control signals WAIT and FB are in the high logic state, at each falling edge of the master clock signal CK the current address register 221 is loaded with the address value present at the output of the first multiplexer 217. The control signal FB is asserted low by the write/read buffer/controller 117 in particular conditions, to be explained later on, for suspending the refresh of the content of the current address register 221.

An output of the current address register 221 feeds an adder circuit 223. The adder circuit 223 is also fed by an output of the second multiplexer 219. An output ADD of the adder circuit 223 is fed to the write/read buffer/controller 117. The output of the adder circuit 223 is also routed back to the register 213 and to the register 215, and directly feeds a further input of the first multiplexer 217. Register refresh control signals CK1 and CK2 enable the loading into the registers 213 and 215, respectively, of the value present at the output ADD of the adder circuit 223.

The register 213 and the adder circuit 223 also feed a comparator 225 that asserts a coincidence signal CNC when coincidence between the address value present in the register 213 and that at the output ADD of the adder circuit 223 is detected.

The operation of the address generator circuit 115 is governed by a state machine, including a status register 229 and a combinatorial circuit 231. In particular, the combinatorial circuit 231 is clocked by the master clock signal CK and receives control signals EOR (end of row) and EOC (end of column) from the topological event generator 121, and a signal ER_D, generated by the read/write sequencer. The combinatorial circuit 231 is also fed by the register 233. Assertion of a start control signal GO, generated by the microprocessor 105 and delivered to the address generator 115 through the bus CBUS, causes the start of the state machine activity. On the basis of the status stored in the status register 229, the combinatorial circuit 231 asserts the signals MUX1, MUX2, for selecting the input of the multiplexers 217 and 219 to be transferred to the output thereof, and the signals CK1, CK2, for enabling the loading of the registers 213 and 215. The combinatorial circuit 231 also generates two control signals RDY and SEL for controlling the operation of the write/read buffer/controller 117.

Figure 3A:
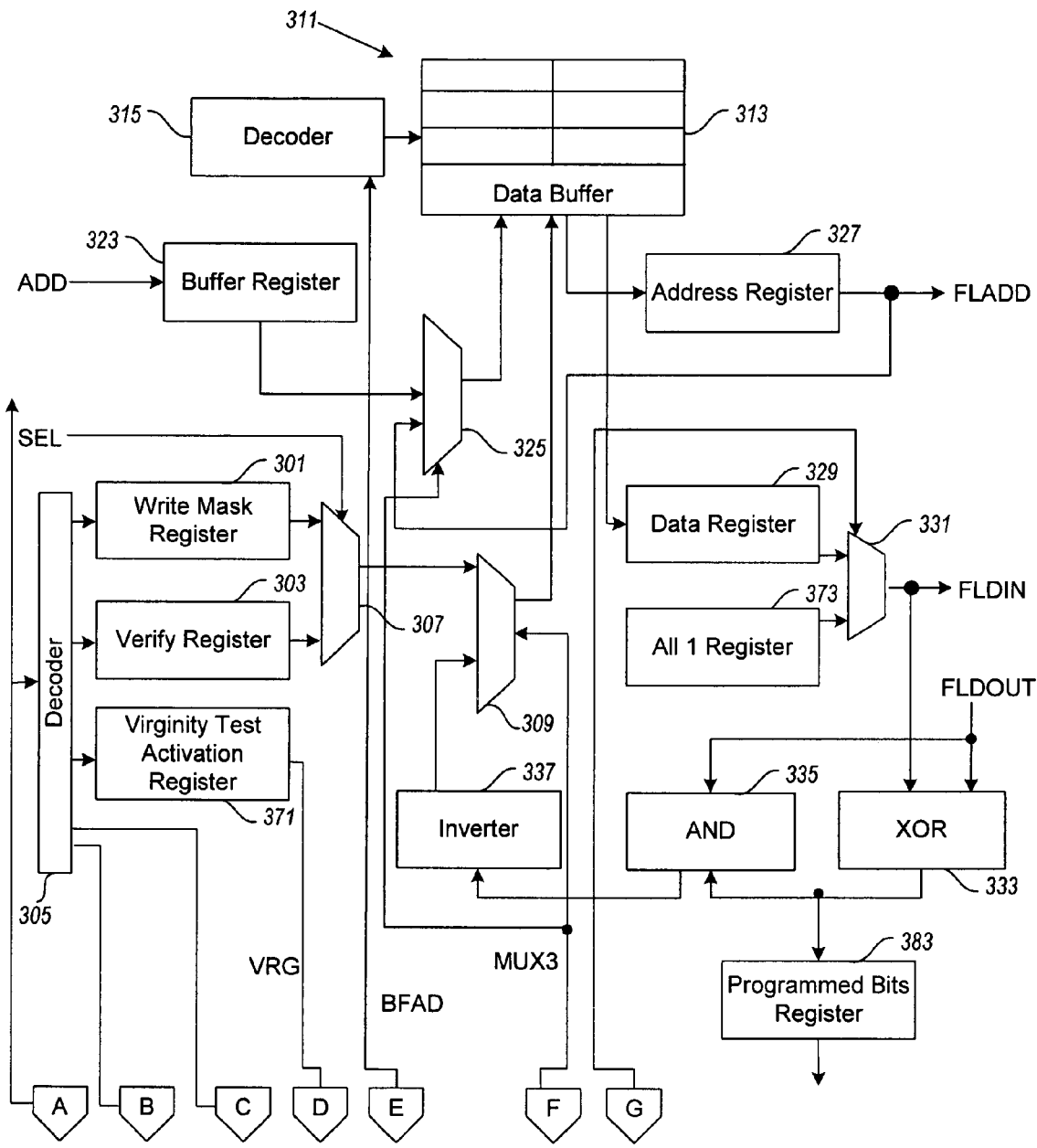
FIG. 3 is a functional block diagram of another functional block of the BIST circuit, including a memory write/read controller unit, in an embodiment of the present invention.
Figure 3B:
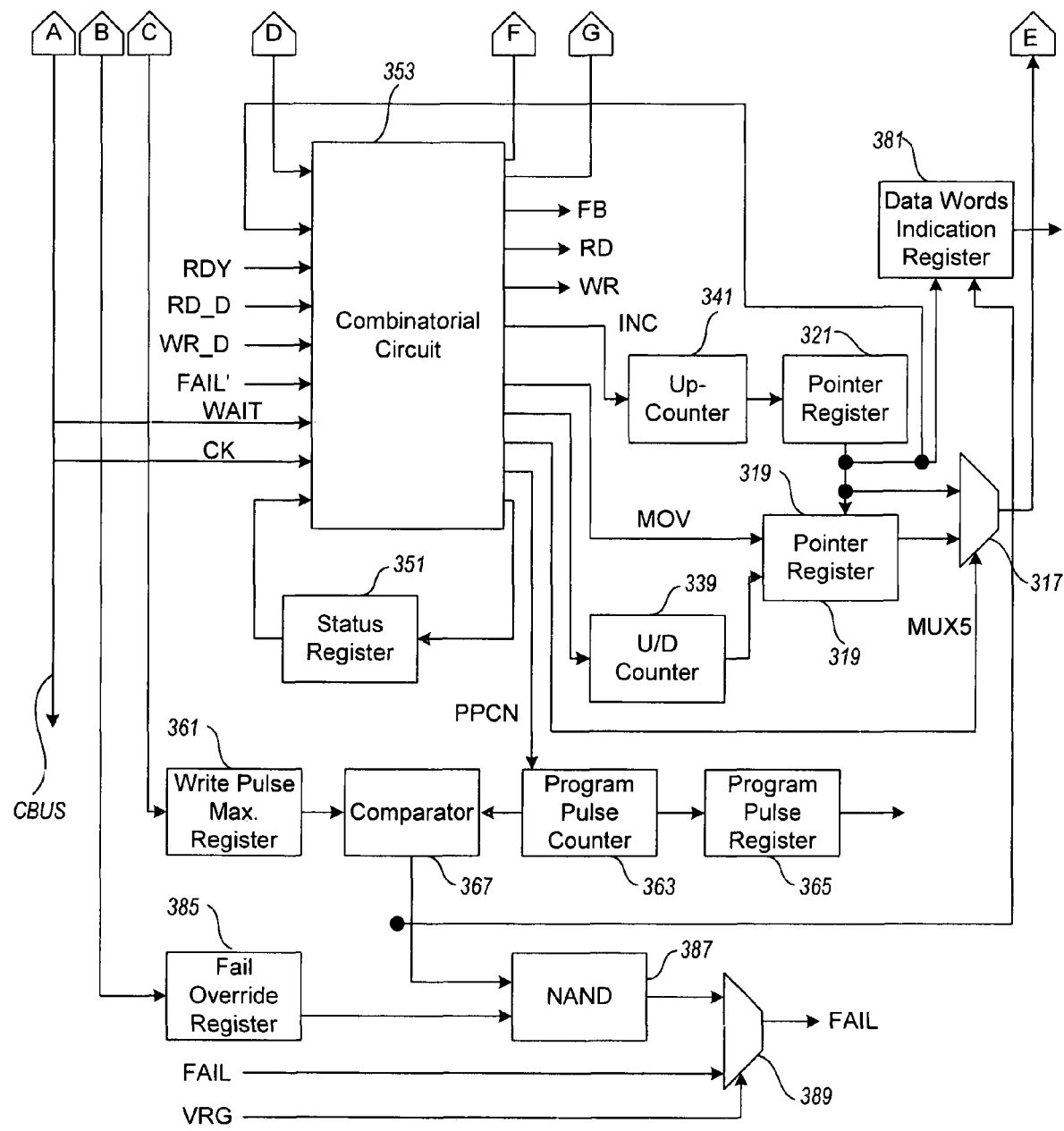

Referring now to FIG. 3, a detailed functional block diagram of the write/read buffer/controller 117 is shown, in accordance with an embodiment of the invention. The circuit includes two configuration parameter registers 301, 303, which are loaded with configuration parameters provided by the microprocessor 105 in the BIST circuit configuration phase. The configuration parameter register 301 is used to store a data word to be repeatedly written into a first subset of locations of the Flash memory 103, according to the desired test pattern. In other words, the configuration parameter register 301 stores a so-called write mask, to be used for programming the Flash memory 103 in a write phase of the test program. The configuration parameter register 303 is instead used to store a data word which, during a verifying phase of the test program, is expected to be found in a second subset of Flash locations, complementary to the first subset, not submitted to writing in the write phase of the test program. In order to be loaded with the desired data word, the two configuration parameter registers 301 and 303 are selected by a decoder 305, that routes the data word present on the bus CBUS to the register addressed by the microprocessor 105.

The two configuration parameter registers 301 and 303 feed a multiplexer 307, controlled by the control signal SEL generated by the address generator 115.

An output of the multiplexer 307 feeds a multiplexer 309. An output of the multiplexer 309 feeds a data buffer 311. The data buffer 311 is capable of storing a prescribed number of data words, to be written into Flash memory locations (in the write phase of the test program) or to be compared to data words read from Flash memory locations (in the write verify phase of the test program); the Flash memory locations are identified by respective addresses stored in an address field 313 of the data buffer 311. For example, the data buffer 311 is capable of storing sixteen data words. The entries of the data buffer 311 are selectable by means of a four-bit digital code BFAD, fed to a decoder 315 associated with the data buffer 311. The digital code BFAD is provided at the output of a multiplexer 317, fed by two pointer registers 319, 321.

The address ADD generated by the address generator circuit 115 is routed, through a register 323 and a multiplexer 325, to the address field 313 of the data buffer 311. The address value read from the pointed data buffer address field 313 of the data buffer 311 is fed to an address register 327; an output of the address register 327 forms a flash address FLADD to be fed to the Flash 103 for accessing the desired Flash memory locations. The output FLADD of the address register 327 is also routed back to the multiplexer 325, thereby the address supplied to the data buffer address field 313 is selectable between the address ADD supplied by the address generator circuit 115 and an address taken from the data buffer 311.

Similarly, the data read from the pointed entry of the data buffer 311 is fed to a data register 329. The data register 329 feeds a multiplexer 331, whose output forms a data word FLDIN to be supplied to the Flash 103 (in the write phase of the test program) or to the comparator circuit 123 (in the write verify phase of the test program).

A circuitry for detecting non-programmed bits in a Flash data word is also provided. The output FLDIN of the multiplexer 331 is also fed to a logic XOR circuit 333, together with a Flash output data word FLDOUT read from the Flash memory 103. The XOR circuit 333 performs a bit-by-bit logic XOR between the two data words. The output of the XOR circuit 333 is fed to a logic AND circuit 335, together with the Flash output data FLDOUT. The AND circuit 335 performs a bit-by-bit logic AND between the data word FLDOUT coming from the Flash 103 and the result of the XOR operation performed by the XOR circuit 333. An output of the AND circuit 335 is supplied to a negation circuit (inverter) 337, performing a bit-by-bit logic negation of the bits at the output of the AND circuit 335. An output of the negation circuit 337 is fed to the multiplexer 309, which is thus capable of selecting which data word, among the data word fed by the multiplexer 307 or the data word supplied by the negation circuit 337, is to be routed to the data buffer 311. A register 383 is provided for storing the output of the XOR circuit 333; the content of the register 383, fed to the CPU 107, provides an indication of the number of programmed bits in a data word.

An up/down counter 339 feeds the pointer register 319; similarly, the pointer register 321 is fed by an up counter 341. The up counter 341 and the pointer register 321 are used for sequentially addressing the entries of the data buffer during a phase of loading the data buffer 311. The combination of the up/down counter 339 and the pointer register 319 is used for scanning the entries of the data buffer 311 during a data write phase, in which the data words stored in the data buffer 311 are read out from the data buffer 311 to be programmed into the Flash memory locations identified by the addresses in the respective address fields 313, and during a data read phase, i.e. the write verify phase following the write phase, in which the Flash locations specified by the addresses in the address field 313 are read for verifying whether the expected data have been written in the specified locations.

The pointer register 319 is connected to the pointer register 321 so as to allow the content of the latter to be loaded into the former.

Similarly to the address generator 115, the operation of the write/read buffer/controller 117 is governed by a state machine, comprising a status register 351 and a combinatorial circuit 353. The state machine generates control signals MUX3, MUX4 and MUX5 for controlling the multiplexers 309, 325 and 317, control signals INC and INC/DEC for controlling the up and up/down counters 341 and 339, and a control signal MOV for enabling the content of the pointer register 321 to be loaded into the pointer register 319.

The state machine of the write/read buffer/controller 117 is clocked by the master clock signal CK, and the activity thereof can be suspended by means of the control signal WAIT.

The write/read buffer/controller 117 also include a circuitry for collecting information regarding the number of program pulses necessary to program a data word in the Flash memory 103. The circuitry comprises a configuration parameter register 361, loadable by the microprocessor 105 in the BIST circuit configuration phase, adapted to store a value indicating the maximum admitted number of write pulses; a program pulse counter 363, controlled by a signal PPCN generated by the state machine 351, 353, for counting the number of write pulses necessary to write a block of data words (the block of data words stored in the data buffer 311) into the specified locations of the Flash 103 (defined in the address field 313 of the data buffer 311); a register 365, the content of which is loaded from the counter 363; a comparator 367, for comparing the value loaded in the BIST circuit configuration phase into the register 361 to the count value reached by the program pulse counter 363. An output of the register 365 is fed to the CPU 107, through the test event masking circuit 125, so that the CPU can read the number of programming pulses that were necessary for writing a given block of data words into the Flash memory 103. When the maximum number of programming pulses is reached, the content of the pointer register 321 is loaded into a register 381; this number, fed to the CPU 107, provides an indication of the data words that have been programmed.

The write/read buffer/controller includes an additional configuration parameter register 371, loadable by the microprocessor 105 in the BIST circuit configuration phase. The register 371, an output VRG of which feeds the combinatorial circuit 353, if set determines the activation of a virginity test on the Flash memory locations before attempting to write therein the data words stored in the data buffer 311. In particular the virginity test, which will be better described later on, provides for feeding to the comparator circuit 123 an "all 1" data word (corresponding to a data word contained in a virgin location of the Flash memory 103), stored in a register 373, by switching the multiplexer 331. The "all 1" data word forms the expected data word to be compared by the comparator 123 to the actual data word read out from the Flash memory 103.

A further configuration parameter register 385, loaded by the microprocessor 105 in the BIST circuit configuration phase, if set enables the operation of the BIST circuit to go on even in presence of a fail detected by the comparator circuit 123 in the write verify phase. The register 385 and the comparator 367 feed a NAND gate 387; the output of the NAND gate 387 feeds one input of a multiplexer 389, another input thereof being fed by the signal FAIL generated by the comparator circuit 123. The multiplexer 389 is controlled by the signal VRG. If the register 385 is not set, and the maximum number of programming pulses is reached, the output of the NAND gate is asserted; provided that the virginity test is not active (the register 371 is not set), the output FAIL' of the multiplexer 389 is asserted, and the state machine 351, 353 stops; if instead the register 385 is set, the signal FAIL' is forcedly kept deasserted, so that the operation of the BIST circuit is not stopped. In case the virginity test is active (the register 371 is set), the signal FAIL' coincides with the signal Fail, thereby the operation of the BIST circuit is stopped as soon as the virginity test fails.

An important function of the write/read buffer/controller 117 is that of reducing the total time required for writing a group of data words into the Flash memory, for the reasons explained hereinafter.

Generally speaking, the writing of data words into the Flash 103 is an operation consisting of four steps.

In a first step, the Flash memory is put in the program operating mode. The Flash internal circuitry is set up for programming the memory cells; in particular, the Flash internal charge pumps, generating the voltages necessary for programming the memory cells, are activated. Some time, typically few µseconds, is required for the charge pump output voltages to settle.

In a second step, a write pulse is applied to the memory cells to be programmed; typically, such a pulse lasts some µseconds.

In a third step, the Flash memory is put in read mode. The charge pumps generate the voltages necessary for sensing the memory cells; since the read voltages are normally different from the programming voltages, some time, typically some µseconds, is required for the charge pump output voltages reaching the prescribed read values.

Finally, in a fourth step the data word is read from the Flash memory, and it is compared to the expected data word. This step takes a time on the order of a hundred of nanoseconds.

When more than one data word is to be written into the Flash memory, the above steps are to be repeated for each data word.

Thanks to the provision of the data buffer 311, only the second and the fourth steps need to be repeated for each data word to be programmed, while the first and third steps are performed only once for each group of data words.

In an alternative embodiment, the data buffer 311 is not provided internally to the write/read buffer/controller 117, being instead a dedicated area (a partition) in the RAM 109. This allows reducing the area occupied by the BIST circuit.

Figure 4:
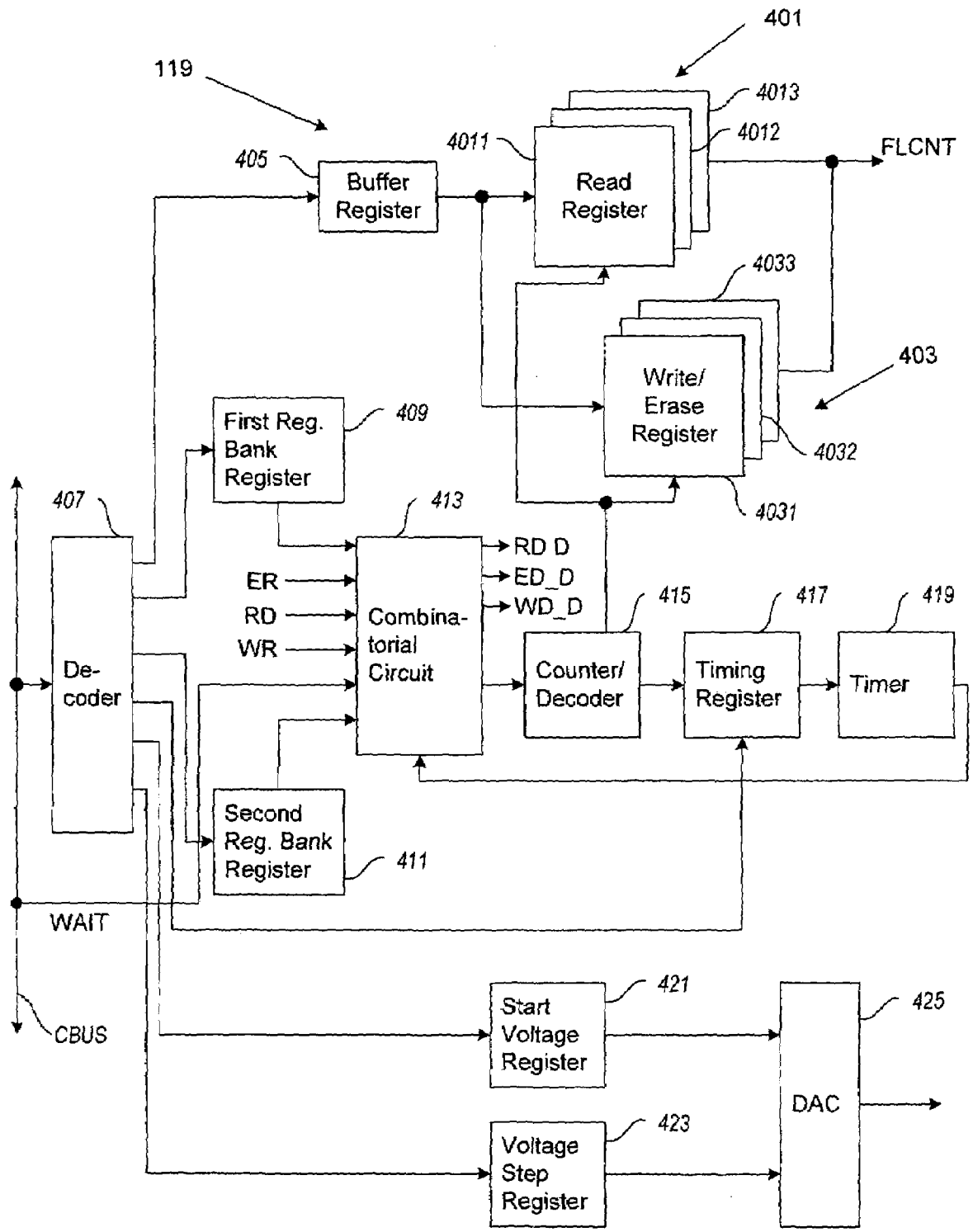
FIG. 4 is a functional block diagram of another functional block of the BIST circuit, including a memory read/write sequencer unit, in an embodiment of the present invention.

Reference is now made to FIG. 4, in which a functional block diagram of a read/write sequencer 119 according to an embodiment of the invention is shown. The function of the read/write sequencer 119 is that of generating control signals, with the proper timing (i.e., proper time delays), for controlling the operation of the Flash memory 103 (read, write, erase). In the shown embodiment, the circuit includes two banks of registers 401, 403, each bank including a respective plurality of registers 4011, 4012, 4013 and 4031, 4032, 4033 (only three registers are shown in each plurality for simplicity). Each register in each bank forms an image of a Flash test register embedded in the Flash memory 103 (schematically shown in FIG. 1 and indicated therein as 1031); each register in each bank is adapted to store a configuration to be loaded into the memory test register 1031. In particular, the registers 4011, 4012, 4013 in the bank 401 are used to store Flash test register configuration data for the read operations to be conducted on the Flash memory 103. The registers 4031, 4032, 4033 in the bank 403 are instead used to store Flash register configuration data for the write and erase operations to be carried on by the Flash 103.

The registers of the banks 401 and 403 are configuration parameter registers loaded by the microprocessor 105 during the BIST circuit configuration phase. A buffer register 405 is provided for receiving and temporarily storing the data from the microprocessor 105, to be then loaded into the prescribed registers of the banks 401 and 403. The buffer register 405 receives the data from the bus CBUS, through a decoder 407.

Two further configuration parameter registers 409 and 411 are provided, loaded by the microprocessor 105 through the decoder 407, for storing values defining the number of registers to be used within the bank 401 and, respectively, the bank 403. The registers 409 and 411 feed a combinatorial circuit 413, governing the operation of the read/write sequencer 119. In particular, the combinatorial circuit 413 controls a counter and decoder circuit 415, acting as a pointer for selecting the registers within the banks 401 and 403. The counter and decoder circuit 415 also acts as a pointer to a timing table, loaded by the microprocessor 105 in the BIST circuit configuration phase into a configuration parameter register 417, containing timing parameters determining the duration of the read, write and erase operations of the Flash memory 103. The timing parameter selected within the table is fed to a timer 419, clocked for example by the master clock signal, calculating the correct time delay for the read, write and erase operations. The timer 419 feeds the combinatorial circuit 413 which generates read, write and erase delay control signals RD_D, WR_D and ER_D to be supplied to other units of the accelerator 113.

The provision of the read and write/erase image registers allows specifying customized command sequences for testing a given kind of Flash 103, which are then fed to the Flash memory 103 through control signals FLCNT.

In a preferred embodiment, the Flash sequencer circuit 119 also includes a circuitry for managing variable voltage levels to be supplied to the Flash 103 as a supply voltage, in order to carry on particular tests. The circuitry includes two configuration parameter registers 421, 423, loadable by the microprocessor 105 through the decoder 407. The register 421 is used to store a value (in binary form) corresponding to a start supply voltage value; the register 423 is used to store a value (in binary form) corresponding to an increase step of the supply voltage value. The registers 421 and 423 feed a digital-to-analog conversion (DAC) circuit 425, converting the values supplied in binary form by the registers 421 and 423 into an analogue supply voltage value.

Similarly to the write/read buffer/controller, in an alternative embodiment of the invention the registers representing the image of the Flash memory test register 1031 are not provided in the read/write sequencer 119, being instead formed by dedicated, reserved locations of the RAM 109. The read/write sequencer 119 includes in this case only one buffer register, and a RAM controller for accessing and reading out the desired RAM locations in which the content to be loaded into the Flash test register is stored. The RAM controller may include three configuration parameter registers, loadable by the microprocessor 105: a first register of the RAM controller is used to store the address of the first RAM dedicated location, a second register of the RAM controller is used to store the address of the last dedicated RAM location, a third register is used to store the address of the destination register, which can be one of the registers in the bank 401 or 403, or the register 417. The RAM controller also includes a counter for sequentially addressing the dedicated RAM locations the content of which is to be fed to the test register 1031 of the Flash memory 103.

Figure 5:
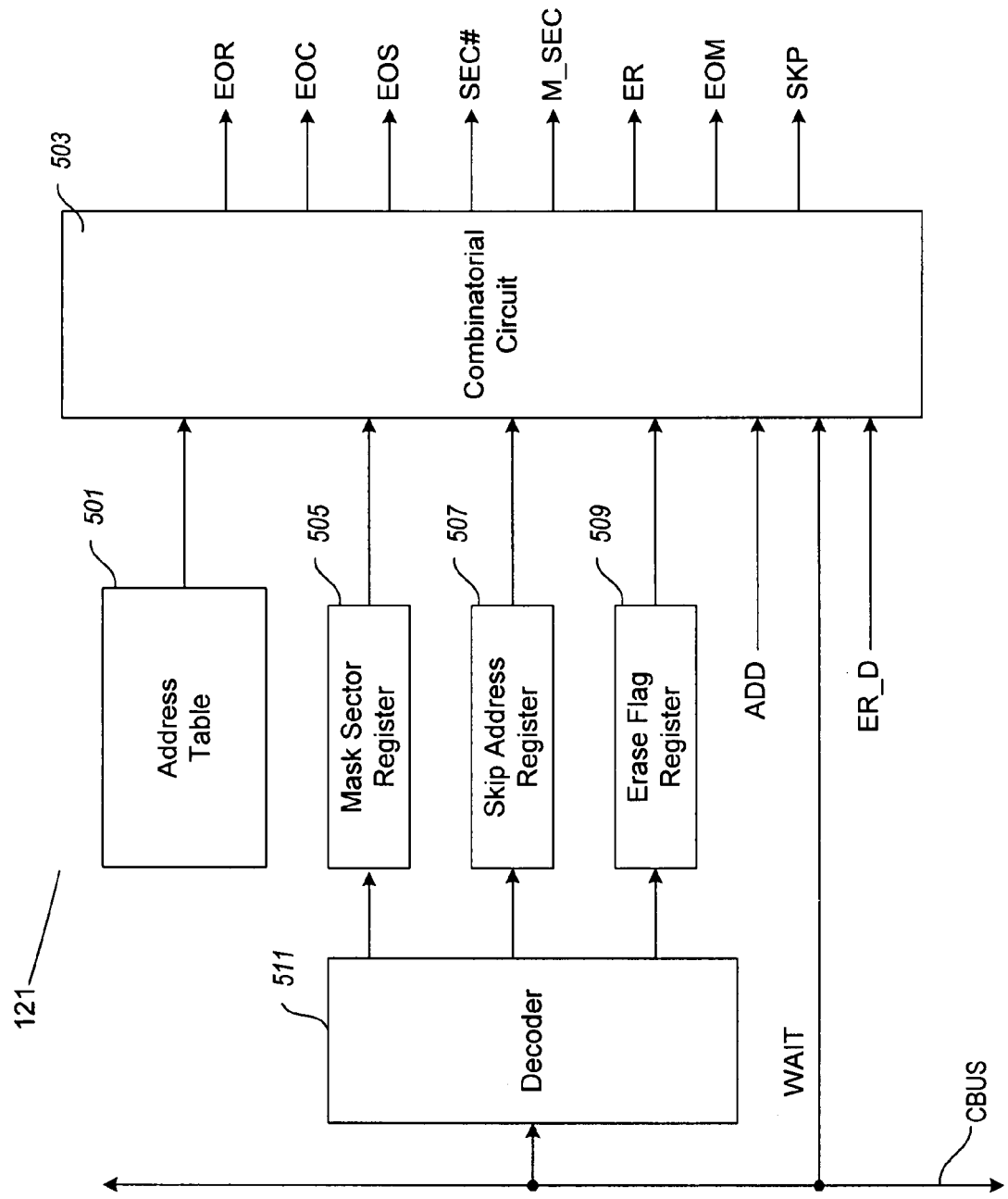
FIG. 5 is a functional block diagram of another functional block of the BIST circuit, including a topological event detector unit, in an embodiment of the present invention.

Making now reference to FIG. 5, a functional block diagram of the topological event detector 121 according to an embodiment of the present invention is shown. The function of the topological event detector 121 is that of monitoring the addresses in the address sequence to be supplied to the Flash memory 103 and, when the detected address coincides with one of a set of particular addresses, signaling to the microprocessor 105 and to the address generator 115 that a topological event occurred. The set of particular addresses includes addresses corresponding to the end of the rows of the matrix, to the end of the columns, to the end the individually-erasable memory sectors, and to the end of the matrix as a whole. When the address to be supplied to the Flash memory 103 coincides with one of these particular addresses, a topological event is decreed. The topological event detector 121 includes a table 501 in which the particular addresses are stored; in particular, the particular addresses may be stored in terms of length of the rows and of the columns of the Flash memory, length of a memory sector, etc. The table 501 may be implemented as a ROM or by means of programmable metal options. The table 501 feeds a combinatorial circuit 503, which is also fed by the address ADD generated by the address generator 115. The combinatorial circuit 503 is capable of detecting the coincidence between the address ADD and one of the particular addresses in the table 501.

The topological event detector 121 also includes configuration parameter registers 505, 507 and 509, loadable by the microprocessor 105 in the BIST circuit configuration phase. As for the formerly described units, the configuration parameter registers 505, 507 and 509 are selected by a decoder 511. The register 505 is used to store a starting address of a memory sector (mask sector) which is to be treated differently from the other memory sectors. The register 507 is used to store a skip address value, e.g. an address at which the test routine is to be terminated. The register 509 is used to store a one-bit flag for the erase phase.

The combinatorial circuit 503 generates signals EOR, EOC, EOS, EOM, SEC#, M-SEC, ER, SKP. The signals EOR and EOC are asserted when an end of row or an end of column occurs, respectively. The control signal EOS is asserted when an end of sector occurs; in this case, signal SEC# carries the number of the ended sector. The signal EOM is asserted when an end of matrix occurs. The signal M-SEC is asserted when the current address ADD coincides with the start address of the mask sector, stored in the register 505. The signal SKP is asserted when the current address ADD coincides with the skip address value stored in the register 507. The signals EOR and EOC are fed to the address generator 115; the signals EOS, SEC#, M-SEC, EOM and SKP are fed to the microprocessor 105, which has the responsibility of deciding how to treat the situation. The signal ER is asserted when an erase of the memory is to be conducted; the assertion of the signal ER, which is fed to the read/write sequencer, causes the activation of the erase operation, with the assertion of the signal ER_D by the read/write sequencer; the signal ER is also fed to the microprocessor, to notify that the erase operation is in execution.

The operation of the BIST circuit will be now described in connection with some typical tests which are normally conducted on Flash memories.

Figure 6:
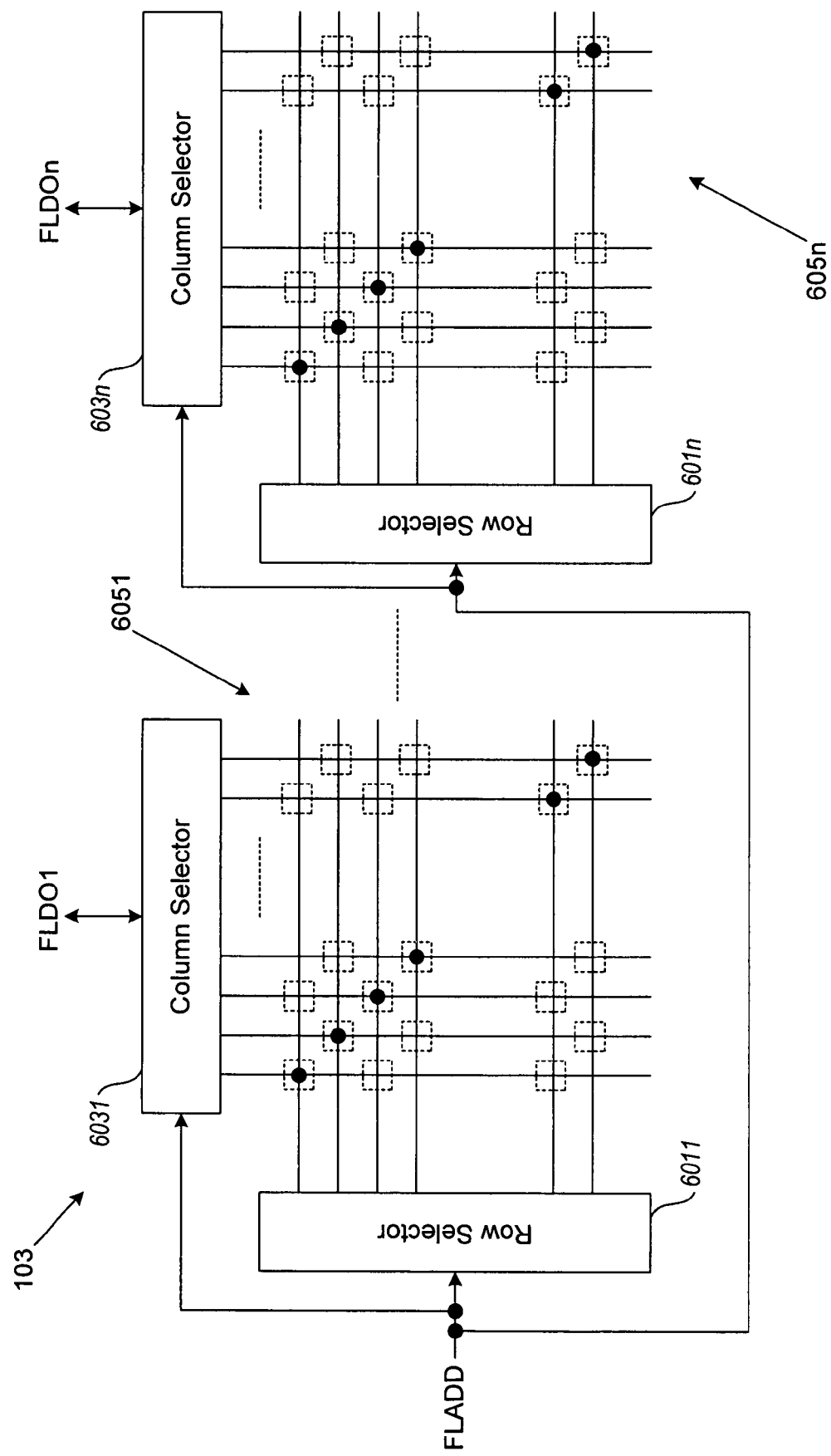
FIG. 6 is a highly simplified representation of the Flash memory integrated in the integrated circuit.

In the following, reference will be made to FIG. 6, in which the Flash memory 103 is shown very schematically. The two arrays of memory cells 6051, ..., 605n shown in the drawings are representative of the memory space reserved to each bit FLDO1, ..., FLDOn of the memory output data word FLDOUT; for example, a Flash memory having a sixteen-bit wide data word will include sixteen arrays similar to the arrays 6051, 605n. Associated with each array are a row selector 6011, 601n and a column selector 6031, 603n, which allow selecting one row and one column of the respective array on the basis of the address FLADD supplied to the Flash memory 103.

Initially, the program to be executed by the microprocessor 105 and the configuration parameters for configuring the accelerator 113 are loaded into the RAM 109. For example, a JTAG protocol is adopted. The configuration parameters allow customizing the operation of the accelerator 113 according to the specific type of Flash to be tested.

Then, the microprocessor 105 starts running according to the loaded program. The configuration parameters are taken from the RAM 109 and loaded into the configuration parameter registers in the various units of the accelerator 113.

One of the typical tests that are normally conducted on a Flash memory (more generally, on an electrically programmable memory) is the so-called diagonal test; the diagonal test provides that only the memory elements belonging to a diagonal of the Flash array are programmed (black dots in FIG. 6), while the remaining elements are left non-programmed. Let it also be assumed that two consecutive addresses differ of a value equal to 1[d], and 100[d] is the number of elements in a generic row of the Flash. The configuration parameter registers 201 and 203 in the address generator 115 are loaded with the values 0[d] (start address) and 101[d] (step), respectively. Assuming that the Flash data words are sixteen-bit wide, the configuration parameter registers 301 and 303 in the write/read buffer/controller 117 are loaded with 0000[h] and FFFF[h], respectively, where by convention the suffix [h] means that the value is expressed in hexadecimal notation.

Another common test is that involving programming the Flash memory according to a checkerboard pattern. In this case, the register 203 is loaded with a step value equal to 2[d].

The so-called "all 0" test involves programming all the memory elements of the Flash memory. In this case, the step value to be loaded into the register 203 is equal to 1[d].

After having loaded the configuration parameter registers of the accelerator 113, the microprocessor 105 starts the accelerator 113, asserting the signal GO. The master clock signal CK provides a time base for the operation of the microprocessor and the units of the accelerator.

The address generator 115 calculates the sequence of addresses identifying the memory elements to be programmed, for example the diagonal elements; starting from the address 0[d], stored in the register 201, the next address is calculated adding (in the adder 223) to the current address, stored in the register 213, the step value 101[d] stored in the configuration parameter register 203.

As the addresses are generated by the address generator 115, they are sequentially fed to the read/write buffer/controller 117, which stores the addresses into the address field 313 of each entry of the data buffer 311. Specifically, each time a new address, calculated by the address generator circuit 115, is available at the output ADD of the adder 223, the address generator 115 asserts the signal RDY. In this phase, the address generator 115 keeps the signal SEL in a state such that the multiplexer 307 in the write/read controller 117 transfers the output of the configuration parameter register 301, storing the data word to be programmed in the Flash locations identified by the addresses generated by the address generator 115. In order to load the data buffer 311, the data buffer load pointer 321 is used (the multiplexer 317 transfers the content of the pointer register 321 onto the signal lines BFAD); each time the address ready signal RDY is asserted by the address generator 115, the up counter 339 is incremented, and its value loaded into the pointer register 321. For each hew address loaded into the data buffer 311, the data word 0000[d] stored in the configuration parameter register 301 is loaded into the data field of the same entry of the data buffer 311.

When the data buffer 311 is full, the read/write buffer/controller 117 asserts the signal FB, thereby causing the address generator 115 to be paused. The up counter 339 stops incrementing the load pointer value.

After having loaded the data buffer 311, the data writing phase begins.

The content of the pointer register 321 is copied into the pointer register 319. The content of the pointer register 321 is also copied into the register 381, for providing the microprocessor with information concerning the number of programmed data words. The pointer register 321 is then reset to zero.

The read/write buffer/controller 117 then asserts the control signal WR, to start the write operation.

The read/write sequencer 119 detects the activation of the signal WR, and the content of the proper image test registers in the bank 403 is copied into the Flash test register 1031. The proper image test register is selected by the counter and decoder circuit 407, which is also used to point to the timing table in the register 417. The timer 411 starts a count down sequence, during which the write delay signal WR_D is kept asserted.

Using the write/read pointer 319, the entries of the data buffer 311 are accessed sequentially. The starting value of the write/read pointer 319 coincides with the value reached by the load pointer 321 during the data buffer load phase. The up/down counter 339 causes the write/read pointer to progressively decrease towards zero. The data buffer is thus scanned in the inverse sequence compared to the load phase, the addresses and data words to be written into the selected Flash locations are sequentially extracted from the data buffer 311, temporarily saved in the registers 327 and 329 and fed to the address input terminals and the data input/output terminals of the Flash 103 over the lines FLADD and FLDIN (the multiplexer 331 transfers the content of the register 329 onto the lines FLDIN).

Once all the data words stored in the data buffer 311 have been fed to the Flash memory for programming, a phase of verify of the programmed Flash locations takes place. The write/read buffer/controller 117 asserts the signal RD, to instruct the read/write sequencer 119 of handling the read sequence. Detecting the assertion of the signal RD, the read/write sequencer 119 copies into the Flash test register 1031 the content of the proper image test registers in the bank 401.

During the verify phase, the write/read pointer 319 is increased from zero to the maximum value (or to the maximum reached address value, still stored in the pointer register 321. The data buffer 311 is scanned in the inverse sequence compared to the scanning sequence adopted in the programming phase, i.e. in the same sequence as the load sequence. For each entry of the data buffer, the address stored in the respective address field is fed to the Flash memory 103, and the expected data (extracted from the data word field of the data buffer entry) is fed to the comparator 123. The comparator 123 compares the read data word to the expected data word for that address and, if a mismatch is detected, the signal FAIL is asserted. When the read/write sequencer 119 deasserts the signal RD, the write/read buffer/controller 117 detects the assertion of the FAIL signal and:

switches the multiplexer 309 onto the output of the negation circuit 337;

switches the multiplexer 325 onto the output of the register 327 (containing the address of the Flash location that generated the failure);

switches the multiplexer 317 onto the output of the load pointer 321.

In this phase, the load pointer 321 is initially reset to zero and is used as a pointer to available entries of the data buffer 311, in which to store the data word to be reprogrammed into the Flash. The XOR, AND, and negation circuits 333, 335 and 337 identify which bits of the Flash data word need to be reprogrammed. Assuming for simplicity of explanation that the Flash data words are made up of eight bits (one byte), and supposing that the expected data word for a specified Flash location is "01010101", while in the verify phase the data word read from that Flash location is "110101 11" (the underlined bits representing the memory cells that have not been programmed), the output of the XOR circuit 333 provides the result "10000010"; this result is put in AND with the read data Word by the AND circuit 335, producing the result "10000010". The negation circuit 337 makes the logic complement of the above data word, producing the result "01111101", which is stored in the first available entry of the data buffer. This means that in the following reprogramming phase only the second and the eighth bits will be written, while the other bits are not submitted to further programming pulses.

After having submitted to verify all the Flash locations whose addresses are specified in the data buffer, the write/read buffer/controller 117 activates a second writing phase, for reprogramming those Flash locations which generated a failure. The writing and verify operations are thus repeated.

The content of the pointer 321 is copied into the pointer 319, and the multiplexer 317 is switched to the pointer 319.

The counter 363 keeps track of the number of programming pulses. The comparator 367 compares the number of programming pulses with the maximum admitted number of pulses set in the configuration parameter register 361. The writing retries are interrupted when the number of programming pulses reaches the maximum admitted number of programming pulses: the signal FAIL' is asserted and fed to the microprocessor 105, which asserts the signal WAIT. This takes place unless the configuration register 385 has been set.

When all the data words loaded into the data buffer 311 have been written into the specified Flash locations without reaching the maximum number of programming pulses, the write/read buffer/controller deasserts the signal FB, thereby the address generator 115 resumes the generation of Flash location addresses. The address generator 115 calculates the next address adding to the last calculated address the step value.

Optionally, before attempting to write the data word into the Flash, a virginity test of the Flash locations to be programmed is conducted. In order to enable the execution of the virginity test, the configuration parameter register 371 must have been set in a prescribed state during the BIST circuit configuration phase. If the register 371 is configured in such a prescribed state, before starting the writing sequence of the data words loaded into the data buffer 311, the write/read buffer/controller 117 commands the activation of a read sequence of the Flash locations whose addresses are stored in the address field 313 of the data buffer 311. The multiplexer 331 transfers to the comparator 123 the value FFFF[h], forming the expected data word; the comparator 123 compares the output data words read from the Flash memory to the expected data word and, if even only one read data word does not coincide with the expected data word, the signal FAIL is asserted and the cycle is stopped.

During the generation of addresses by the address generator 115, the topological event detector 121 monitors the address ADD currently present at the output of the adder 223. The address ADD is compared to the addresses stored in the table 501. The topological event detector 121 is thus capable of detecting the reaching of topological boundaries of the memory matrix. For example, the topological event detector 121 detects whether an end of row, an end of column, an end of sector, an end of matrix are reached. In such cases, the topological event detector 121 notifies the other units of the accelerator 113 and the microprocessor 105, depending on the type of event occurred. In particular, when an end of row or an end of column is reached, the topological event detector 121 asserts the signal EOR or EOC, respectively. When an end of sector is reached, the signal EOS is asserted, and the microprocessor 105 is notified of this event. In case an end of matrix event occurs, the topological event detector 121 signals the event to the microprocessor 105 (asserting the signal EOM). Notification of these topological events to the microprocessor 105 may be prevented by the event mask circuit 125.

Occurrence of events such as an end of row or an end of column causes the address generator 115 to depart from the normal behavior. Let for example the case of a test involving programming the Flash memory according to a checkerboard pattern be considered; referring to FIG. 6, the memory cells to be programmed are schematically identified by dashed squares. During the BIST circuit configuration phase, the start address value 0[d] and the step value 2[d] are loaded into the configuration parameter registers 201 and 203. The address generator 115 then starts generating the sequence of addresses, progressively increasing the start address by 2[d]. When the first row ends, the next address to be generated must be the last generated address plus 2[d] plus 1[d], so the address generator 115 must depart from the normal address generation procedure. The topological event detector 121, continuously checking the last address ADD calculated by the address generator 115, detects that the next address calculated by the address generator 115 corresponds to a new row, and therefore asserts the signal EOR. The address generator 115 detects the assertion of the signal EOR, and thus, before asserting the signal RDY that causes the write/read buffer/controller 117 to load the new address into the data buffer 311, adds to the last calculated address the value 1[d]: the multiplexer 219 transfers to the adder circuit 223 the content of the register 207, so that the correct next address is calculated; the topological event detector 121 deasserts the signal EOR, and the address generator 115 asserts the address ready signal RDY.

Similarly, when the second row ends, the assertion of the signal EOR causes the address generator 115 to subtract 1[d] from the address calculated according to the normal procedure: in this case, the multiplexer 219 transfers to the adder circuit 223 the content of the register 209.

The previous description referred to the case of a scanning of the Flash memory by rows; the behavior is totally similar when a scanning by columns is set (configuration parameter register 233): the occurrence of end of columns events is signaled to the address generator by asserting the end of column signal EOC.

The provision of the configuration parameter register 205 allows setting a generic correction value, different from +1[d] or −1[d], for correctly handling the end of row and end of column events in the case the pattern differs from the checkerboard one.

As mentioned, the provision of the parameter configuration register 233 allows selecting the scan direction (by rows or by columns) of the matrix of memory cells. The provision of the register 215 allows correctly handling end of column events when a scan by columns is selected. For example, let the case of an "all 0" test be considered. Assuming again that the number of elements in each row is equal to 100[d], the increment between two consecutive addresses is equal to 100[d]; however, when a column ends, the next address to be calculated must be equal to the address of the first element of the previous column, plus one. The register 215 allows storing the address of the first element of a given column while such column is scanned; when the end of column signal EOC is asserted, the multiplexer 217 transfers to the register 221 the content of the register 215 instead of the content of the register 213, thereby the next calculated address (last column, first element address plus 1[d]) correctly identifies the first element of the next column.

After having written the Flash locations according to the desired pattern, the actual memory content needs to be verified.

As for the write procedure, the microprocessor program and the BIST circuit configuration parameters are loaded into the RAM 109 by the tester 127. Then, the microprocessor 105 loads the configuration parameters into the correct configuration parameter registers in the various units of the accelerator 113.

Continuing with the exemplary case of the diagonal test, the register 201 is loaded with the value of the start address, 0[d] in this example, and the register 205 is loaded with the increment step value 101[d]. The register 301 in the Write/read buffer/controller 117 is loaded with the data word expected to be found (because previously written) in the elements of the diagonal (0000[h], in this example), While the register 303 is loaded with the data word expected to be found in the elements not belonging to the diagonal (FFFF [h], in the present example).

The microprocessor then starts the accelerator 113, asserting the signal GO, and the verify procedure begins.

It is observed that during the verify procedure, differently from the previously described programming procedure, all the elements of the Flash memory 103 need to be accessed for verifying the respective content. The address generator 115 must thus generate all the addresses, in sequence (depending on the scan direction set by the value loaded into the register 233). Let it be assumed that a scan by rows is selected: the address generator 115 must generate all the addresses, starting from the start address: 0[d], 1[d], 2[d], . . . , 100[d], 101[d], 102[d], . . . . As the addresses are calculated, they are passed to the write/read buffer/controller 117, which stores in the data buffer 311 the newly received address together with the associated expected data word. The data word to be loaded into the data buffer is selected among the data word stored in the register 301 (data word expected to be found in the elements of the diagonal) and that stored in the register 303 (data word expected to be found in the elements out of the diagonal). In order to enable the write/read buffer/controller 117 deciding which expected data word is to be associated with any given address, the address generator 115 properly asserts the signal SEL. To do this, the address generator 115 needs keeping track of the addresses generated, and establish if the currently generated address is one identifying the elements of the diagonal or not.

Referring to FIG. 2, after detecting the assertion of the signal GO, the register 213 is cleared, the multiplexer 217 transfers to the register 221 the content of the start address register 201, and the multiplexer 219 transfers to the adder circuit 223 the content of the register 235 (containing the 0[d]value). The adder circuit 223 calculates the next address, equal to the starting address 0[d]. This address, present at the output ADD of the adder 223, identifies an element of the diagonal, and coincides with the address stored in the register 213; the comparator 225 detects the matching, thereby the signal SEL is activated to inform the write/read buffer/controller 117 that this address is to be associated with the data word stored in the register 301. Then the signal RDY is asserted, to enable the write/read buffer/controller 117 storing the address and the related data word into the data buffer 311. The coincidence detected by the comparator 225 also causes the multiplexer 219 transferring to the adder circuit the step value stored in the register 203 (101[d]): the step value 101[d] is added to the address 0[d], and the resulting address 101[d] is stored in the register 213. The multiplexer 219 is then switched onto the output of the register 207, containing the step value 1[d], and this step value is added by the adder circuit 223 to the address value 0[d] still contained in the register 221. The resulting 1[d] address value, present at the output ADD of the adder circuit 223, is compared by the comparator 225 to the value stored in the register 213: since no coincidence is detected, the signal SEL is not asserted, so that when the signal RDY is asserted, the write/read buffer/controller 117 stores in the data buffer 311 the new address and the data word stored in the register 303. The new calculated address 1[d] is routed back to the multiplexer 217, which transfers such an address to the register 221; then, this address is added to the step value 1[d], and the new address 2[d] is obtained.

Each time the data buffer 311 is fully loaded with addresses and data words, the write/read buffer/controller asserts the signal FB, thereby causing the address generator to suspend the generation of the next address. The write/read buffer/controller 117 then starts a read operation of the Flash locations whose addresses are stored in the data buffer 311. The write/read buffer/controller asserts the signal RD, so that the read/write sequencer 119 copies into the test registers of the Flash memory 103 the data stored in the image test registers 401 for starting the read operation.

The addresses contained in the data buffer are fed sequentially to the Flash memory; to this purpose, the pointer 319 is used. For each address supplied to the Flash memory, the write/read buffer/controller 117 supplies the correspondent expected data word to the comparator 123. The comparator compares the expected data word with the data word read from the flash. In case of mismatch, the comparator 123 asserts the signal FAIL.

During the operation of the accelerator 103, the microprocessor 105 monitors a test advancement status by polling the signals generated by the topological event detector and the signal FAIL' generated by the write/read buffer/controller. Events such as the reaching of the end of a sector, the end of the matrix, the beginning of a mask sector or the reaching of a skip address are signaled to the microprocessor 105, which has the responsibility of handling such events.

The provision of the event masking circuit 125, which is optional, allows masking to the microprocessor 105 some or all of these topological events.

Based on the received signals, the microprocessor builds a test result table. At the end of the test, the microprocessor 105 provides to the tester 127 the test result table.

Although the present invention has been disclosed and described by way of some embodiments, it is apparent to those skilled in the art that several modifications to the described embodiments, as well as other embodiments of the present invention are possible without departing from the scope thereof as defined in the appended claims.

In particular, and by way of example only, the configuration parameter registers in the various units of the accelerator might be directly loaded by the tester, for example using the same JTAG protocol.

Albeit the invention embodiment described in the foregoing is related to a Flash memory, this is not to be intended as limitative to the present invention, which can be applied in general for realizing a BIST circuit for any kind of semiconductor memory.

Even more generally, the invention can be applied to the design of BIST circuits for testing integrated circuits belonging to classes other than semiconductor memories, by adapting the units making up the accelerator to the specific class of integrated circuit to be tested.

In particular, the BIST circuit according to the present invention is particularly adapted to implement the test of integrated circuits including collection of addressable elements arranged regularly (for example, monodimensional arrays, bidimensional arrays—matrices—and the like), such as for example RAMs and ROMs, FPGAs ("Field Programmable Gate Arrays"), SOGs ("Sea Of Gates"). In particular, the BIST circuit according to the present invention is particularly flexible, although not developed ad hoc for a given integrated circuit, and efficiently implements the test of memories having relatively complex test procedures.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

The invention claimed is:

1. A built-in self-test (BIST) circuit to be embedded in an integrated circuit to test the integrated circuit, the BIST circuit comprising:
a general-purpose data processor programmable to execute a test program to test the integrated circuit; and
an accelerator circuit in cooperation with the general-purpose data processor to autonomously conduct operations on the integrated circuit according to the test program, the accelerator circuit including configuration means to be loaded with configuration parameters by the data processor for adapting the accelerator circuit to a specific type of integrated circuit to be tested and a specific type of test program.

2. The BIST circuit according to claim 1 wherein the integrated circuit to be tested includes a collection of addressable elements.

3. The BIST circuit according to claim 2 wherein the accelerator circuit comprises:
an address generator circuit to generate sequences of addresses to identify elements in the collection to be scanned in the test program, the address generator circuit comprising address generator configuration means for storing element collection scan pattern definition parameters provided by the data processor and defining a pattern of generation of the sequence of addresses.

4. The BIST circuit according to claim 3 wherein the element collection scan pattern definition parameters include a staffing address and an address increment value, the address generator circuit being structured to implement a base address sequence generation routine that, starting from the staffing address, repeatedly adds the increment value.

5. The BIST circuit according to claim 4 wherein the accelerator circuit comprises a topological event detector circuit to monitor the addresses generated by the address generator circuit to detect a reaching of topological boundaries of the collection of elements, potentially necessitating a departure from the base address sequence generation routine.

6. The BIST circuit according to claim 5 wherein the address generator circuit comprises means for causing the generated addresses to depart from the base address sequence generation routine upon notification by the topological event detector circuit of the reaching of one of the topological boundaries.

7. The BIST circuit of claim 5 wherein said topological boundaries of the collection of elements include an end of row, an end of column, an end of sector, and an end of matrix of the elements of the collection of elements to be scanned.

8. The BIST circuit according to claim 3 wherein the accelerator circuit further comprises a buffer circuit comprising a buffer to store groups of addresses generated by the address generator circuit, together with respective data words to be written into elements of the collection identified by said addresses during an element collection write phase of the test program, thereby the data words are written into the collection of elements by blocks.

9. The BIST circuit according to claim 8 wherein the buffer stores addresses generated by the address generator circuit together with respective expected data words, expected to be found in elements of the collection identified by said addresses during an element collection read phase of the test program.

10. The BIST circuit according to claim 3 wherein the pattern includes a checkerboard pattern.

11. The BIST circuit according to claim 2 wherein said collection of addressable elements is a collection of memory locations of a semiconductor memory.

12. The BIST circuit according to claim 2 wherein the accelerator circuit comprises a controller circuit to supply the collection of addressable elements with control information determining operation of the collection of addressable elements.

13. The BIST circuit according to claim 12 wherein the control information is part of the configuration parameters.

14. A configurable, built-in self-test (BIST) circuit to test an integrated circuit in cooperation with a data processor, the integrated circuit including a collection of addressable elements, the built-in self-test circuit comprising:
an address generator that generates sequences of addresses that identify elements in the collection, the address generator including a plurality of registers that store scan pattern definition parameters provided by the processor and that define a pattern of generation of the sequence of addresses; and
a write/read controller coupled to the address generator and including:
a data buffer that stores test data to test the integrated circuit;
a controller that transmits the test data and sequence of addresses to the integrated circuit for testing; and
an evaluation circuit that receives and evaluates test results from the integrated circuit and modifies the test data stored in the data buffer in response to evaluation of the test results.

15. The BIST circuit according to claim 14 wherein the scan pattern definition parameters include a starting address and an address increment value, the address generator being structured to implement a base address sequence generation routine that, staffing from the staffing address, repeatedly adds the increment value.

16. The BIST circuit according to claim 15, further comprising a topological event detector circuit to monitor the addresses generated by the address generator to detect a reaching of topological boundaries of the collection of elements.

17. The BIST circuit according to claim 16 wherein the address generator comprises means for causing the generated addresses to depart from the base address sequence generation routine upon notification by the topological event detector circuit of the reaching of one of the topological boundaries.

18. The BIST circuit of claim 16 wherein said topological boundaries of the collection of elements include an end of row, an end of column, an end of sector, and an end of matrix of the elements of the collection of elements to be scanned.

19. The BIST circuit according to claim 14 wherein the evaluation circuit includes:
a first logic element structured to compare a test datum of the test data stored in the data buffer with a read datum of the test results received from the integrated circuit and produce a comparison output; and
a second logic element coupled to the first logic element and structured to produce from the comparison output a new test datum that is sent to the data buffer for storage.

20. The BIST circuit according to claim 14 wherein the write/read controller includes:
a write mask register that stores test data received from the data processor;

a multiplexer having an output terminal coupled to the data buffer and first and second input terminals coupled respectively to the write mask register and the evaluation circuit; and a state machine structured to cause the multiplexer to send to the data buffer the test data from the write mask register during a configuration phase and to cause the multiplexer to send the data buffer new test data from the evaluation circuit during a test phase.

21. The BIST circuit according to claim 14 wherein the pattern includes a checkerboard pattern.

22. A method of testing an integrated circuit using a built-in self-test circuit in cooperation with a general-purpose processor that are both embedded in the integrated circuit, the method comprising:

configuring an accelerator circuit by storing in the accelerator circuit configuration parameters provided by the general-purpose processor for adapting the accelerator circuit to the integrated circuit and to a specific type of test program to be performed on the integrated circuit; and autonomously conducting operations of the test program on the integrated circuit according to the configuration parameters stored in the accelerator circuit.

23. The method of claim 22, further comprising:
storing initial test data in a data buffer;
using the initial test data to test the integrated circuit;
receiving test results from the integrated circuit in response to testing the integrated circuit;
creating new test data based on the test results; and
storing the new test data in the data buffer for subsequent testing of the integrated circuit.

24. The method of claim 22 wherein the integrated circuit includes a collection of addressable elements, wherein the configuration parameters provided by the processor define an address generation pattern associated with addresses of the addressable elements, and wherein conducting operations of the test program on the integrated circuit includes testing the addresses of the addressable elements according to the pattern.

25. The method of claim 24 wherein testing the addresses according to the pattern includes testing the addresses according to a checkerboard pattern.

26. The method of claim 24, further comprising monitoring addresses generated according to the pattern to detect boundaries of elements of the collection of addressable elements that are to be tested.

* * * * *